(12) United States Patent
Uchida

(10) Patent No.: US 7,906,899 B2
(45) Date of Patent: Mar. 15, 2011

(54) ORGANIC EL DEVICE, LINE HEAD, AND ELECTRONIC APPARATUS WITH LIGHT SHIELD

(75) Inventor: Masahiro Uchida, Chino (JP)

(73) Assignee: Seiko Epson Corporation, Tokyo (JP)

( * ) Notice: Subject to any disclaimer, the term of this patent is extended or adjusted under 35 U.S.C. 154(b) by 288 days.

(21) Appl. No.: 12/033,206

(22) Filed: Feb. 19, 2008

(65) Prior Publication Data

US 2008/0303420 A1 Dec. 11, 2008

(30) Foreign Application Priority Data

Mar. 19, 2007 (JP) ................................ 2007-070902

(51) Int. Cl.
*H01J 1/62* (2006.01)
*H01J 63/04* (2006.01)
(52) U.S. Cl. ........................................ 313/504; 313/503
(58) Field of Classification Search ..................... 445/24, 445/25; 313/504, 506, 512, 510, 117, 110, 313/503; 315/169.3; 428/690, 917, 411.1; 427/66; 345/76, 45, 36; 257/40, 500, 86
See application file for complete search history.

(56) References Cited

U.S. PATENT DOCUMENTS

| | | | | |
|---|---|---|---|---|
| 7,612,496 B2 * | 11/2009 | Cok | ............................... | 313/504 |
| 7,646,144 B2 * | 1/2010 | Cok | ............................... | 313/503 |
| 2003/0201716 A1 * | 10/2003 | Yamazaki et al. | ............ | 313/506 |
| 2004/0178722 A1 * | 9/2004 | Cok et al. | ...................... | 313/506 |
| 2005/0116620 A1 * | 6/2005 | Kobayashi | .................... | 313/503 |
| 2005/0253508 A1 * | 11/2005 | Okano | ......................... | 313/506 |
| 2006/0007071 A1 * | 1/2006 | Yamazaki et al. | .............. | 345/76 |
| 2007/0069635 A1 * | 3/2007 | Cok | ............................... | 313/504 |
| 2007/0138946 A1 * | 6/2007 | Cok | ............................... | 313/504 |
| 2008/0054802 A1 * | 3/2008 | Cok | ............................... | 313/506 |
| 2008/0079352 A1 * | 4/2008 | Cok | ............................... | 313/503 |
| 2008/0138657 A1 * | 6/2008 | Lee et al. | ...................... | 428/690 |

FOREIGN PATENT DOCUMENTS

JP   A 2005-158583   6/2005
WO   WO 2005114762 A1 * 12/2005

* cited by examiner

*Primary Examiner* — Nimeshkumar D Patel
*Assistant Examiner* — Glenn Zimmerman
(74) *Attorney, Agent, or Firm* — Oliff & Berridge PLC

(57) ABSTRACT

A top emission-type organic EL device includes a first electrode formed on a substrate, an organic function layer formed on the first electrode, and a second electrode formed on the organic function layer, wherein light generated from the organic function layer is extracted from the second electrode side, and wherein a light shielding layer covering a part of the second electrode is formed on the second electrode.

20 Claims, 5 Drawing Sheets

ORGANIC EL DEVICE, LINE HEAD, AND ELECTRONIC APPARATUS WITH LIGHT SHIELD

BACKGROUND

1. Technical Field

The present invention relates to an organic EL device, a line head, and an electronic apparatus.

2. Related Art

An organic EL device is a self light emitting device not requiring a light source such as a back light. An organic function layer of the organic EL device has a configuration in which the organic function layer is pinched by a pixel electrode (first electrode) and an opposing electrode (second electrode).

When an electric potential difference is generated between the pixel electrode and the common electrode, holes injected from the pixel electrode and electrons injected from the common electrode are combined on the organic function layer so as to emit light (JP-A-2005-158583).

Generally, in the above-described organic EL device, a conductive polymer is used as a hole injecting layer constituting the organic function layer. However, since a current flows in the conductive polymer isotropically, the current flows in areas other than an area regulated between the two electrodes. Accordingly, a light emitting area of the organic function layer becomes larger than the area regulated by the two electrodes.

For example, when this organic EL device is used in a line head of an image forming apparatus, light spreads and is irradiated from the light emitting area, and accordingly, it is difficult to improve the resolution of an image. Therefore, the display quality of the image forming apparatus has been limited.

SUMMARY

An advantage of some aspects of the invention is that it provides an organic EL device, a line head, and an electronic apparatus which achieve high resolution by reducing the light emitting area so as to suppress spread of light.

According to aspects of the invention, there are provided an organic EL device, a line head, and an electronic apparatus.

According to a first aspect of the invention, there is provided a top emission-type organic EL device including: a first electrode formed on a substrate; an organic function layer formed on the first electrode; and a second electrode formed on the organic function layer. Light generated from the organic function layer is extracted from the second electrode side, and a light shielding layer covering a part of the second electrode is formed on the second electrode. By using this structure, the light shielding layer covers a part of the second electrode, and thereby an organic EL device having an excellent light emitting capability without blur of light emission and un-uniformity of light intensity can be provided.

It is preferable that the light shielding layer includes an opening part, which has a shape similar to that of the second electrode, on the second electrode. By using this structure, the light shielding layer uniformly covers the peripheral edge portion of the second electrode, and thereby an organic EL device having an excellent light emitting capability without blur of light emission and un-uniformity of light intensity can be provided.

It is preferable that the first electrode is partitioned on the substrate by a partition wall having an opening part on the first electrode and the light shielding layer includes an opening part, which has a shape similar to that of the opening part of the partition wall, on the second electrode. By using this structure, the light shielding layer uniformly covers the peripheral edge portion of the second electrode, and thereby an organic EL device having an excellent light emitting capability without blur of light emission and un-uniformity of light intensity can be provided.

It is preferable that the opening part of the light shielding layer is formed within a plane area of the first electrode. By using this structure, the light shielding layer is opened on the organic function layer that emits light, and accordingly, the loss of a light amount in the opening part can be reduced. In addition, an organic EL device having an excellent light emitting capability without blur of light emission and un-uniformity of light intensity can be provided.

It is preferable that the center of the opening part of the light shielding layer is disposed to coincide with the center of the second electrode or the center of the opening part of the partition wall. By using this structure, light generated from the organic function layer can be effectively irradiated from the opening part, and accordingly, the loss of a light amount in the opening part can be prevented. In addition, an organic EL device having an excellent light emitting capability without blur of light emission and un-uniformity of light intensity can be provided.

It is preferable that the opening part of the light shielding layer has an approximately circular shape in a plan view. By using this structure, a circular light source can be formed, and thereby an organic EL device having an excellent capability for the use for which a circular light source is preferable such as the use of a line head or the like.

According to a second aspect of the invention, there is provided a top emission-type organic EL device including: a first electrode formed on a substrate; an organic function layer formed on the first electrode; and a second electrode formed on the organic function layer; and an auxiliary electrode formed on the second electrode so as to be brought into contact with the second electrode. The light generated from the organic function layer is extracted from the second electrode side, and the auxiliary electrode covers a part of the second electrode so as to partially shield light emitted from the organic function layer. By using this structure, the auxiliary electrode covers a part of the second electrode, and thereby an organic EL device having an excellent light emitting capability without blur of light emission and un-uniformity of light intensity can be provided.

It is preferable that the auxiliary electrode includes an opening part, which has a shape similar to that of the second electrode, on the second electrode. By using this structure, the auxiliary electrode uniformly covers the peripheral edge portion of the second electrode, and thereby an organic EL device having an excellent light emitting capability without blur of light emission and un-uniformity of light intensity can be provided.

It is preferable that the first electrode is partitioned on the substrate by a partition wall having an opening part on the first electrode, and the auxiliary electrode includes an opening part, which has a shape similar to that of the opening part of the partition wall, on the second electrode. By using this structure, the light shielding layer uniformly covers the peripheral edge portion of the second electrode, and thereby an organic EL device having an excellent light emitting capability without blur of light emission and un-uniformity of light intensity can be provided.

It is preferable that the opening part of the auxiliary electrode is formed within a plane area of the first electrode. By using this structure, the auxiliary electrode is opened on the organic function layer that emits light, and accordingly, the loss of a light amount in the opening part can be reduced. In addition, an organic EL device having an excellent light emitting capability without blur of light emission and un-uniformity of light intensity can be provided.

It is preferable that the center of the opening part of the auxiliary electrode is disposed to coincide with the center of the second electrode or the center of the opening part of the partition wall. By using this structure, light generated from the organic function layer can be effectively irradiated from the opening part, and accordingly, the loss of a light amount in the opening part can be prevented. In addition, an organic EL device having an excellent light emitting capability without blur of light emission and un-uniformity of light intensity can be provided.

It is preferable that the opening part of the auxiliary electrode has an approximately circular shape in a plan view. By using this structure, a circular light source can be formed, and thereby an organic EL device having an excellent capability for the use for which a circular light source is preferable such as the use of a line head or the like.

It is preferable that the light shielding layer or the auxiliary electrode has a light reflecting property. In this case, since light transmitted from the organic function layer is not absorbed by the light shielding layer or the auxiliary electrode, the loss of a light amount in the opening part can be prevented. In addition, an organic EL device having an excellent light emitting capability without blur of light emission and un-uniformity of light intensity can be provided.

According to a third aspect of the invention, there is provided a line head including the above-described organic EL device. By including this organic EL device, the light shielding layer or the auxiliary electrode covers the peripheral edge portion of the second electrode, and accordingly, the light emitting area can be reduced, and thereby a line head capable of achieving excellent display quality can be provided.

According to a fourth aspect of the invention, there is provided an electronic apparatus including the above-described organic EL device. By including this organic EL device, the light shielding layer or the auxiliary electrode covers the peripheral edge portion of the second electrode, and accordingly, the light emitting area can be reduced, and thereby an electronic apparatus having an excellent light emitting capability without blur of light emission and un-uniformity of light intensity can be provided.

BRIEF DESCRIPTION OF THE DRAWINGS

The invention will be described with reference to the accompanying drawings, wherein like numbers reference like elements.

DESCRIPTION OF EXEMPLARY EMBODIMENTS

Figure 1:
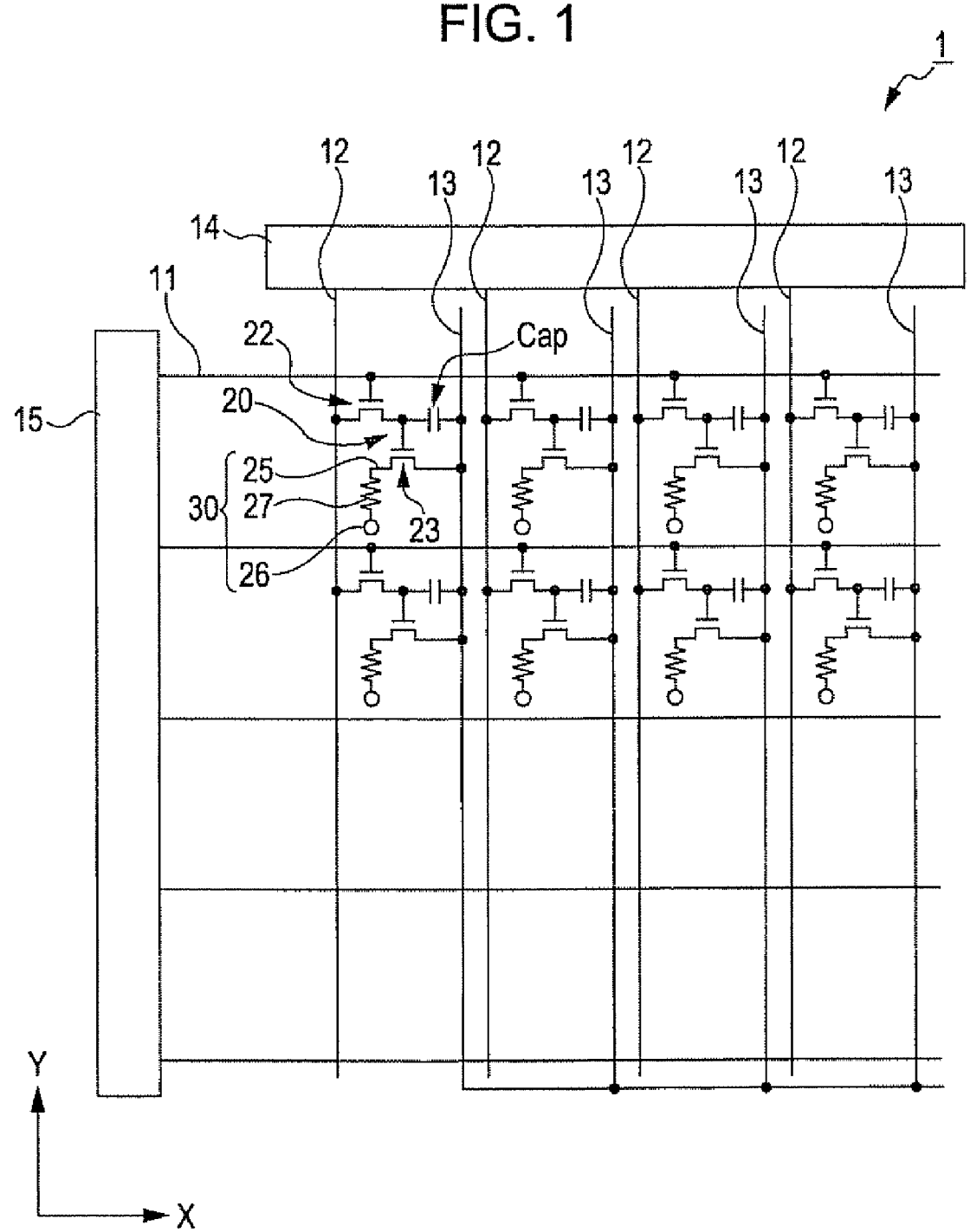
FIG. 1 is a circuit diagram equivalent to an organic EL device according to an embodiment of the invention.

Hereinafter, an embodiment of the present invention will be described with reference to the accompanying drawings. This embodiment represents an aspect of a part of the invention and is not for the purpose of limiting the invention. Therefore, the embodiment may be arbitrary changed or modified without departing from the scope of the technical idea of the invention. In the drawings represented below, in order to adjust the sizes of layers and members to be recognizable from the drawings, the scales of the layers and the components are represented to be different from one another.

FIG. 1 is a circuit diagram equivalent to an organic EL device 1. First, the wiring configuration of the organic EL device 1 according to an embodiment of the invention will be described. In the organic EL device 1, a plurality of scanning lines 11 extending in the direction of axis X, a plurality of signal lines 12 intersecting with the plurality of scanning lines 11 and extending in the direction of axis Y, and a plurality of power lines 13 extending in the direction of axis Y are disposed. A pixel area 20 corresponds to an area surrounded by a scanning line 11 and a signal line 12. To the pixel area 20, a scanning line driving circuit 15 is connected though the can line 11 and a signal line driving circuit 14 is connected through the signal line 12. The scanning line driving circuit 15 includes a shift register, a level shifter, and the like. The signal line driving circuit 14 includes a shift register, a level shifter, a video line, an analog switch, and the like.

In each pixel area 20, a switching TFT (Thin Film Transistor) 22 whose gate is supplied with a scan signal through a scan line 11, a retention capacitor Cap for maintaining an image signal supplied from the data line 12 through the switching TFT 22, a driving TFT 23 whose gate is supplied with the image signal maintained by the retention capacitor Cap, a pixel electrode (first electrode) 25 which is electrically connected to a power line 13 through the driving TFT 23 and to which a current is flowed in from the power line 13, and an organic function layer 27 pinched by this pixel electrode 25 and an opposing electrode (second electrode) 26 are disposed. An organic EL device 30 is constituted by the pixel electrode 25, the opposing electrode 26, and the organic function layer 27.

Under the above-described circuit configuration, when the switching TFT 22 is driven in accordance with a driving signal supplied from the scan line 11, the electric potential of the signal line 12 at the moment is maintained by the retention capacitor Cap. The driving TFT 23 is controlled on the basis of the electric potential maintained in the retention capacitor Cap. By connecting the pixel electrode 25 to the power line 13 through a channel of the driving TFT 23, a current from the power line 13 is input to the pixel electrode 25. As a current flows through the organic function layer 27 on the basis of an electric potential difference between the pixel electrode 25 and the opposing electrode 26, the organic function layer 27 emits light. The amount of light emission of the organic function layer 27 changes depending on the amount of the current.

Figure 2:
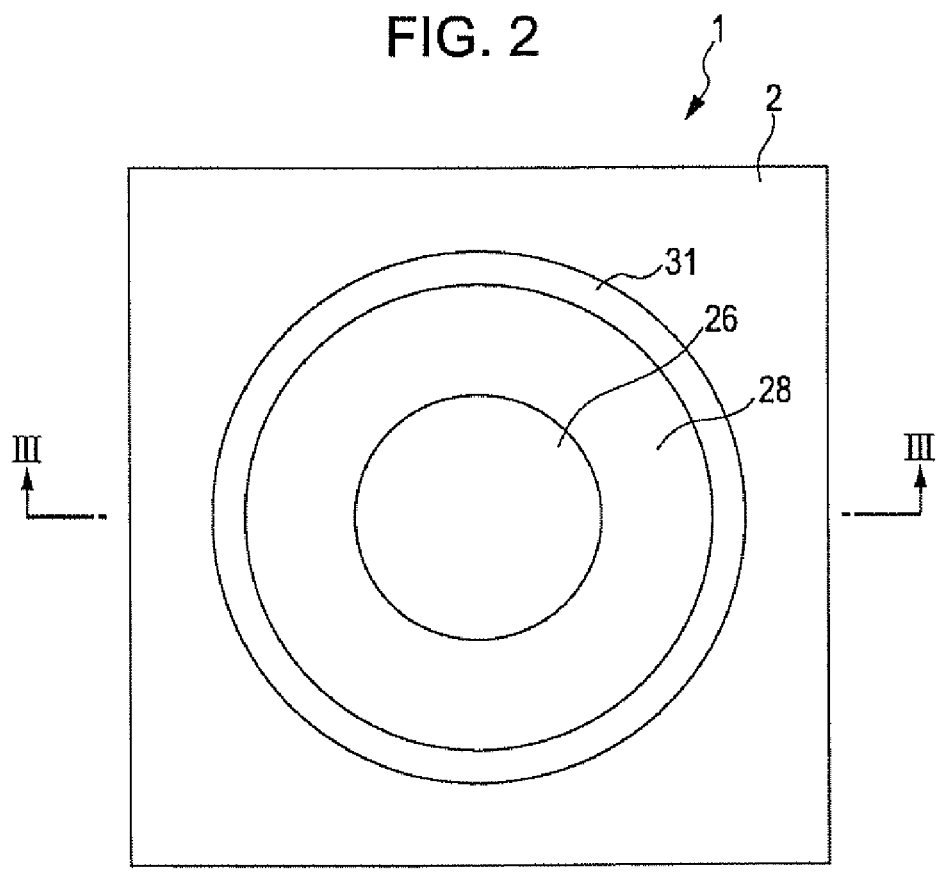
FIG. 2 is a schematic plan view of the organic EL device.
Figure 3:
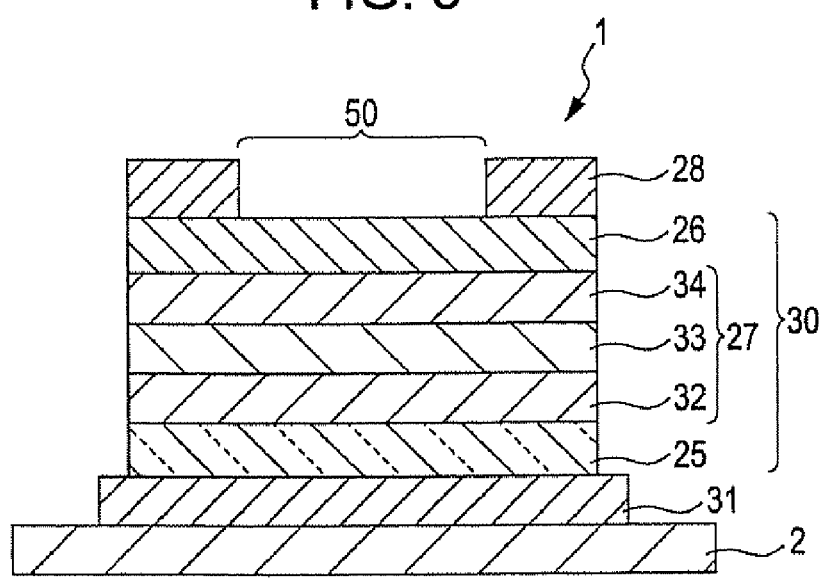
FIG. 3 is a sectional diagram of FIG. 2 taken along line III-III.

FIG. 2 is a schematic plan view of the organic EL device 1 according to this embodiment. FIG. 3 is a sectional view of the organic EL device 1 shown in FIG. 2 taken along line III-III. As shown in FIGS. 2 and 3, on the substrate 2, a reflection layer 31 is formed. On the reflection layer 31, the pixel electrode 25 is formed. On the pixel electrode 25, the organic function layer 27 constituted by a hole injection layer 32, a light emitting layer 33, and an electron injection layer 34 is stacked. On the organic function layer 27, the opposing electrode 26 is formed. On the top surface of the opposing electrode 26, an auxiliary electrode 28 is formed. The auxiliary electrode 28 is formed to cover the peripheral edge portion of the opposing electrode 26. Accordingly, an opening part 50 of the auxiliary electrode 28 is formed in a plane area of the pixel electrode 25.

When the organic EL device 1 having a top emission structure is used, light is extracted through the opposing electrode 26, and accordingly an opaque substrate along with a transparent substrate such as a glass substrate may be used as the substrate 2. As the opaque substrate, for example, a substrate made of ceramic such as alumina, a metal sheet to which an insulation process such as a surface oxidation is performed, or a thermosetting resin, a thermoplastic resin may be used. Although not shown in the figure, a circuit element such as the driving TFT 23 and the like are formed on the substrate 2.

On the substrate 2, the reflection layer 31 is formed. The reflection layer 31 is made of a material such as aluminum or silver which has a light-reflecting property. The pixel electrode 25 is formed on the top face of the reflection layer 31 and used as a positive electrode of the organic EL device 30. The pixel electrode 25 is made of a material such as ITO (Indium Tin Oxide) which is transparent and has conductivity.

On the top surface of the pixel electrode 25, the hole injection layer 32 is formed. As the material of the hole injection layer 32, a PEDT (Poly Ethylene Dioxy Thiophene)/PSS (Poly Stylene Sulfonic Acid) dispersion liquid or the like may be used. The hole injection layer 32 is formed by drying and baking the PEDT/PSS dispersion liquid ejected on the pixel electrode 25 by using an ink jet method or the like.

On the top surface of hole injection layer 32, the light emitting layer 33 is formed. The light emitting layer 33 is formed by performing a drying process and an annealing treatment for a material emitting a red color, a green color, a blue color, and the like which has been ejected on the hole injection layer 32 by using an ink jet method or the like.

On the top surface of the light emitting layer 33, the electron injection layer 34 is formed. The electron injection layer 34 is formed of a calcium thin film or the like so as to have a light-transmitting property. The electron injection layer 34 is formed by using a vacuum deposition method or the like. It is preferable that the film thickness of the electron injection layer 34 is equal to or less then 5 nm.

On the top surfaces of the electron injection layer 34 and the partition wall 42, the opposing electrode 26 is formed. The opposing electrode 26 is made of a thin film such as gold or ITO so as to have a light-transmitting property. It is preferable that the film thickness of the opposing electrode 26 is equal to or less then 5 nm.

On the top surface of the opposing electrode 26, the auxiliary electrode 28 is formed. The auxiliary electrode 28 is formed to cover the peripheral edge portion of the opposing electrode 26, and the opening part 50 is formed on the opposing electrode 26. This opening part 50 is formed within the plane area of the pixel electrode 25 and has a shape similar to that of the opposing electrode 26. As the material of the auxiliary electrode 28, a material such as aluminum which has superior conductivity, a superior light-shielding property, and a superior light-reflecting property is used. A light shielding layer having a light-shielding property may be formed by replacing the auxiliary electrode 28.

Although not shown in the figure, on the top surface of the auxiliary electrode 28, a protection film is formed. On the protection film, the opposing substrate facing the substrate 2 is formed. For the protection film and the opposing substrate, a material having a light-transmitting property is used.

In a general organic EL device, light generated from the light emitting layer is irradiated from the whole organic EL device 30, and accordingly, a light emitting area inside the organic EL device 30 cannot be reduced. However, in the organic EL device 1 according to an embodiment of the invention, the auxiliary electrode 28 covers the peripheral edge portion of the top surface of the opposing electrode 26 having a light-shielding property, and thus, the light emitting area can be reduced. Accordingly, by using this organic EL device 1, light with high precision such as fine light can be easily acquired.

In addition, from the reflection layer 31 and the auxiliary electrode 28, shown in FIG. 3, the light generated from the light emitting layer 33 is reflected, and thus, the light intensity in the opening part 50 can be increased. Thus, since light intensity equivalent to that in the general organic EL device can be acquired with flow of less current, the organic EL device 1 according to an embodiment of the invention is effective for reducing power consumption. When a material having a light reflecting property is used for the above-described light shielding layer, the same advantage can be acquired.

Line Head

Figure 4:
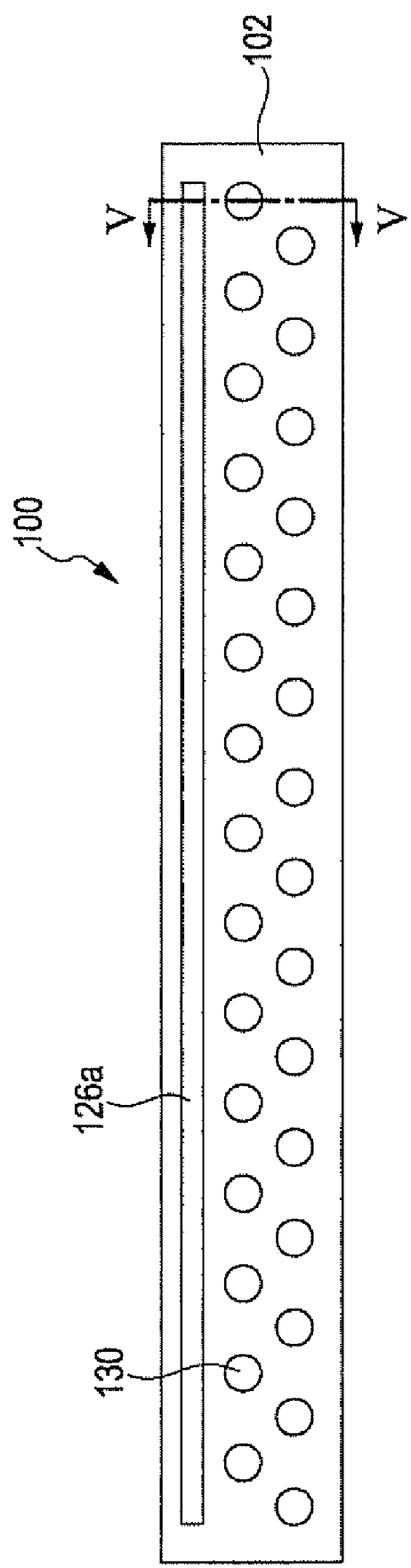
FIG. 4 is a schematic plan view of a line head according to another embodiment of the invention.

FIG. 4 is a plan view of a line head 100 having the organic EL device 30 according to an embodiment of the invention. According to the line head 100, on a substrate 102 having a long and thin rectangular shape, an organic EL device 130 having a zigzag shape in two rows, an opposing electrode contact wiring 126a for supplying electric potential to the opposing electrode (not shown) of the organic EL device 130, a drive device (not shown) for driving the organic EL device 130, and the like are formed. Alternatively, the organic EL device 130 may be disposed in one row.

Figure 5:
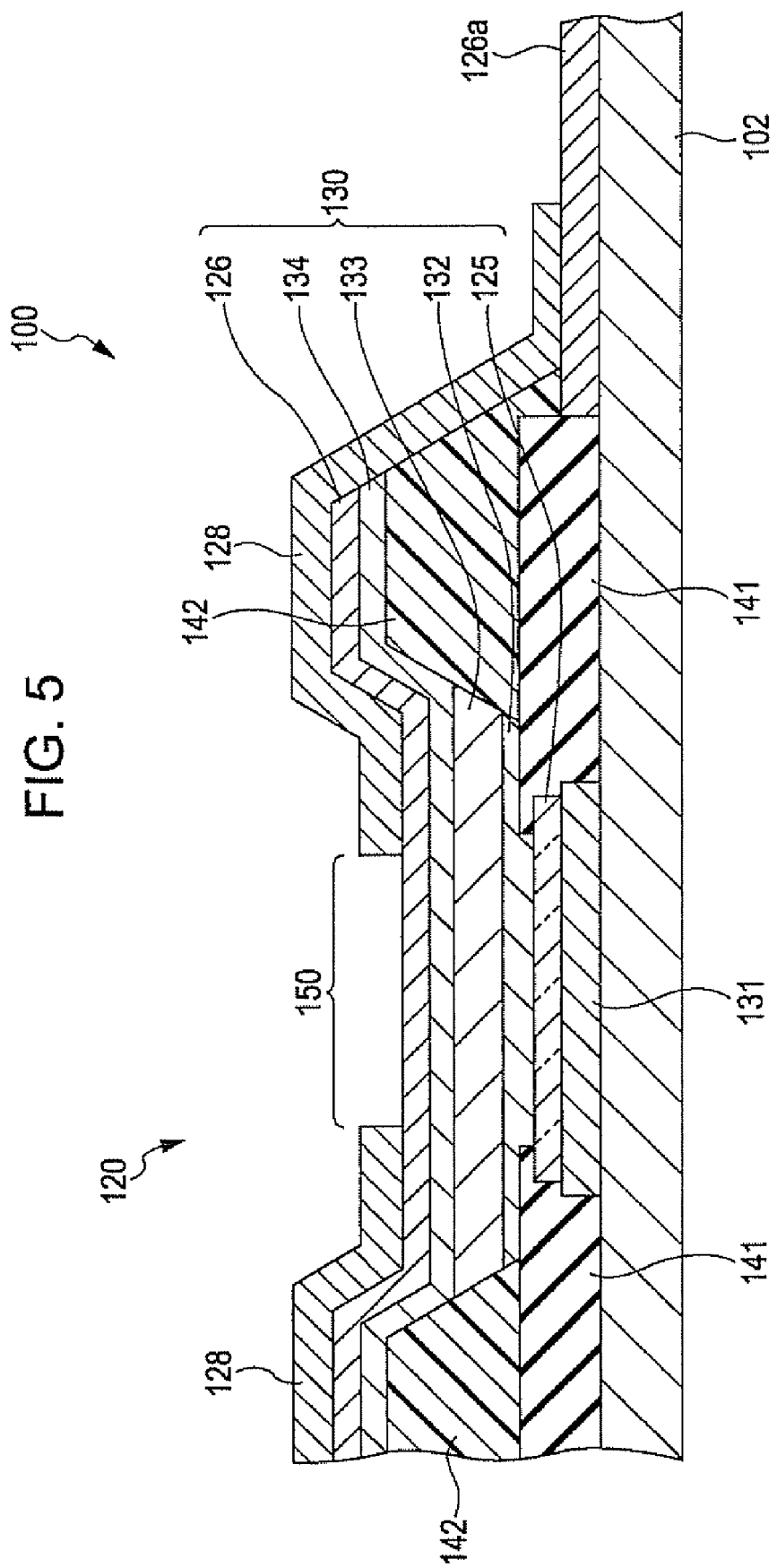
FIG. 5 is a sectional view of FIG. 4 taken along line V-V.

FIG. 5 is a sectional view of FIG. 4 taken along line V-V. On the substrate 102, a plurality of structures in which the reflection layer 131 and the pixel electrode 125 are stacked are arranged in correspondence with each organic EL device 130. In areas between the pixel electrodes 125, a first partition wall 141 is formed so as to electrically insulate the adjacent pixel electrode 125. This first partition wall 141 is formed to be on the peripheral edge portion of the pixel electrode 25, and an opening part is formed on the pixel electrode 125. For the first partition wall 141, an inorganic material such as $SiO_2$ is used.

On the top surface of the first partition wall 141, a second partition wall 142 is stacked. The second partition wall 142 is formed of an organic material such as acryl. An opening part that becomes the pixel area 120 including the organic EL device 130 is formed by the second partition wall 142. The pixel area 120 is formed to have an approximate rectangular shape, an approximate circular shape, or the like.

In the pixel area 120, on the top surfaces of the pixel electrode 125 and the first partition wall 141, the hole injection layer 132 and the light emitting layer 133 are sequentially stacked. These layers are formed by using a same method as that of forming the organic EL device 1, and a red light emitting polymer is used as the material of the light emitting layer 133. Although the electron injection layer 134 and the opposing electrode 126 are formed on the top surfaces of the pixel area 120 and the second partition wall, they do not extend to a position of the opposing electrode contact wiring 126a used for supplying the electric potential to the opposing electrode 126.

On the top surface of the opposing electrode 126, the auxiliary electrode 128 is formed. The auxiliary electrode 128 is formed to extend over the peripheral edge portion of the pixel area 120, the second partition wall 142, and the opposing electrode contact wiring 126a. Since the auxiliary electrode 128 is formed on the peripheral edge portion of the pixel area 120, the opening part 150 is formed on the organic EL device 130. This opening part 150 is formed within a plane area of the opening part of the first partition wall 141 and is formed to have a shape similar to that of the pixel area 120. The auxiliary electrode 128 is electrically connected to the above-described opposing electrode contact wiring 126a and supplies an electric potential to the opposing electrode 126 that is brought into contact with the auxiliary electrode 128.

Although not shown in the figure, on the top surface of the auxiliary electrode 128, a protection film is formed. In addition, on the protection film, an opposing substrate facing the substrate 102 is formed. For the protection film and the opposing substrate, a material having a light-transmitting property is used.

Figure 6:
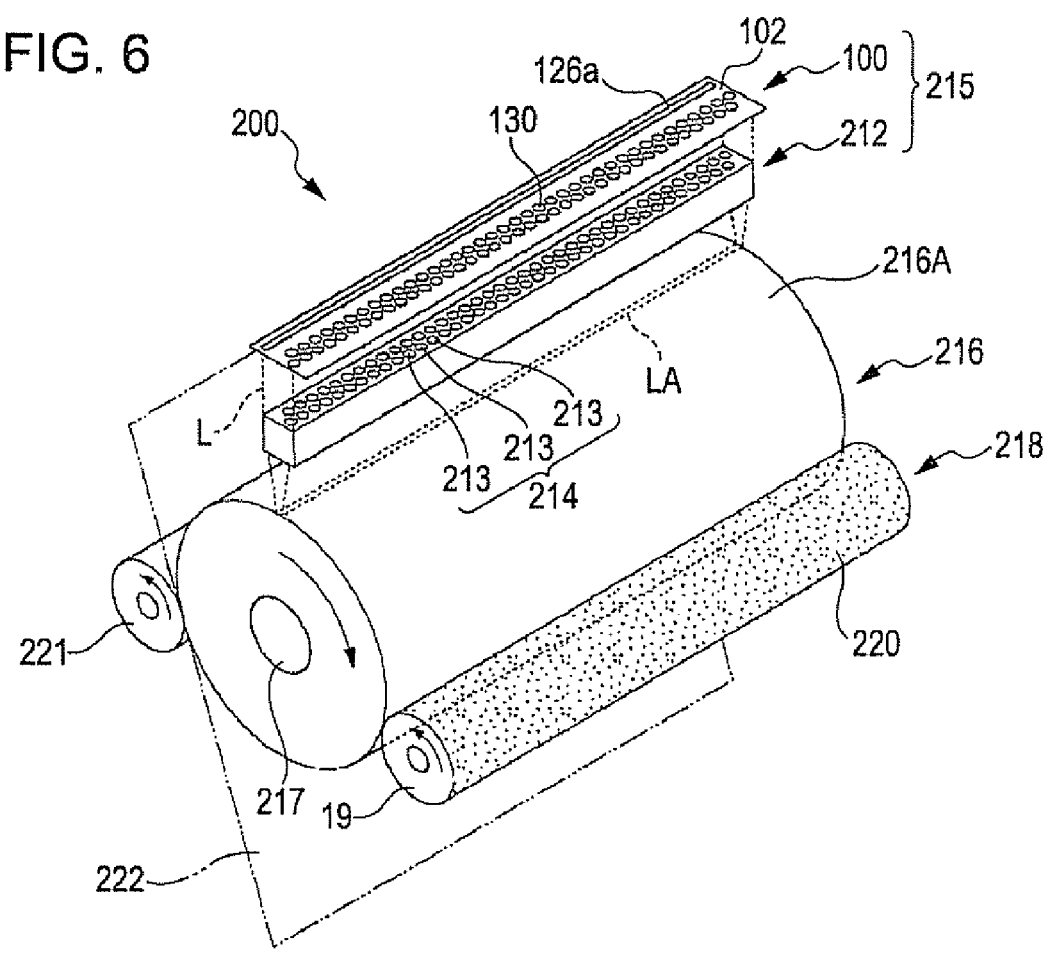
FIG. 6 is a schematic diagram showing the configuration of an image forming apparatus according to an embodiment of the invention.

FIG. 6 is a schematic diagram showing the configuration of an image forming apparatus 200 having the line head 100. The image forming apparatus 200 includes a photoconductor drum 216 serving as an image carrier 216 located near the traveling path of a transfer medium 222. Around the photoconductor drum 216, an exposure device 215, a development device 218, and a transfer roller 221 are sequentially disposed along the rotation direction (represented by an arrow in the figure) of the photoconductor drum 216. The photoconductor drum 216 is disposed around the rotation shaft 217 to be rotatable, and on the center portion of the peripheral surface of the photoconductor drum 216 in the rotation shaft direction, a photosensitive surface 216A is formed. The exposure device 215 and the development device 218 are disposed on a long axis along the rotation shaft 217 of the photoconductor drum 216, and the width of the exposure device 215 and the development device 218 in the direction of the long axis approximately coincides with that of the photosensitive surface 216A.

In this image forming apparatus 200, first, in the process of rotation of the photoconductor drum 216, the surface (photosensitive surface 216A) of the photoconductor drum 216 is, for example, positively (+) charged by a charging device (not shown) that is disposed on the upper stream side of the exposure device 215. Then, the surface of the photoconductor drum 216 is exposed by the exposure device 215, and thereby an electrostatic latent image LA is formed on the surface. In addition, a toner (developer) 220 is deposited on the surface of the photoconductor drum 216 by a development roller 219 of the development device 218, and a toner image corresponding to the electrostatic latent image LA is formed in accordance with electrical absorption power of the electrostatic latent image LA. Particles of the toner are positively (+) charged.

After the toner image is formed by the development device 218, the toner image is brought into contact with the transfer medium 222 by additional rotation of the photoconductor drum 216, and charges (here, negative (−) charges) having a polarity opposite to that of the toner particles of the toner image are deposited from the rear surface of the transfer medium 222 by the transfer roller 221. Accordingly, the toner particles forming the toner image are absorbed into the transfer medium 222 from the surface of the photoconductor drum 216, and thus, the toner image is transferred on the transfer medium 222.

The exposure device 215 includes a line head 100 and an image forming optical element 212 having a plurality of lens elements 213 for forming an erect image of light L irradiated from the line head 100 with a same scale. The line head 100 and the image forming optical element 212 in a state that both components are aligned to each other are supported by a head case, not shown in the figure, and are fixed on the photoconductor drum 216.

The image forming optical element 212 includes a lens element array 214 formed by arranging lens elements 213 having a same configuration as that of a SELFOC (registered trademark) lens element manufactured by Nippon Sheet Glass Company, Limited in two rows in a zigzag form along the rotation shaft 217 of the photoconductor drum 216.

By using the organic EL device 30 according to an embodiment of the invention in the line head 100, the auxiliary electrode 128 having a light shielding property covers the peripheral edge portion of the pixel area 120, and thereby the light emitting area can be reduced. Accordingly, a thin light source with high precision or the like can be formed in an easy manner by using this line head 100, and it is possible to manufacture an image forming apparatus 200 having a capability of high resolution.

Electronic Apparatus

Figure 7:
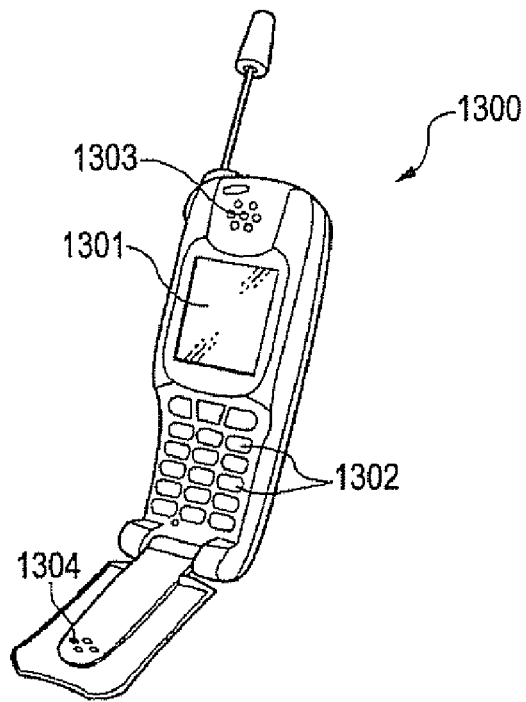
FIG. 7 is a diagram showing an electronic apparatus including the organic EL device according to another embodiment of the invention.

Next, an electronic apparatus having an organic EL device 1 according to an embodiment of the invention will be described with reference to FIG. 7. FIG. 7 is a schematic diagram showing the configuration of a cellular phone in which the organic EL device 1 shown in FIG. 1 as an example of the organic EL device according to an embodiment of the invention is used as a display unit of the cellular phone. The cellular phone 1300 shown in the figure has the organic EL device 1 according to the above-described embodiment as a small sized display unit 1301, a plurality of operation buttons 1302, an ear piece 1303, and a mouthpiece 1304. The application of the organic EL device 1 according to the above-described embodiment is not limited to the cellular phone. The organic EL device 1 may be appropriately used as an image display unit of an electronic book, a projector, a personal computer, a digital still camera, a television set, a video cassette recorder of a view finder type or a monitor direct-viewing type, a car navigation equipment, a pager, an electronic calendar, a calculator, a word processor, a workstation, a video phone, a POS terminal, a device having a touch panel, or the like. Accordingly, by using the above-described configuration, an electronic device having a superior light-emitting characteristic can be provided.

The entire disclosure of Japanese Patent Application No. 2007-070902, filed Mar. 19, 2007 is expressly incorporated by reference herein.

What is claimed is:

1. A top emission-type organic EL device comprising: a first electrode formed on a substrate; an organic function layer formed on the first electrode; and a second electrode formed on the organic function layer, wherein light generated from the organic function layer is extracted from the second electrode side, wherein a light shielding layer directly covering only a peripheral portion of the second electrode is formed on the second electrode, wherein the first electrode is partitioned on the substrate by a partition wall having an opening part on the first electrode, and wherein the partition wall includes a first partition wall and a second partition wall, and the first partition wall is formed to cover a portion of a top surface of the first electrode.

2. The organic EL device according to claim 1, wherein the light shielding layer includes an opening part, which has a shape similar to that of the second electrode, on the second electrode.

3. The organic EL device according to claim 2, wherein the light shielding layer includes an opening part, which has a shape similar to that of the opening part of the partition wall, on the second electrode.

4. The organic EL device according to claim 2, wherein the opening part of the light shielding layer is formed within a plane area of the first electrode.

5. The organic EL device according to claim 3, wherein the center of the opening part of the light shielding layer is disposed to coincide with the center of the second electrode or the center of the opening part of the partition wall.

6. The organic EL device according to claim 2, wherein the opening part of the light shielding layer has an approximately circular shape in a plan view.

7. A top emission-type organic EL device comprising: a first electrode formed on a substrate; an organic function layer formed on the first electrode; a second electrode formed on the organic function layer; and an auxiliary electrode formed on the second electrode so as to be brought into contact with the second electrode, wherein light generated from the organic function layer is extracted from the second electrode side, wherein the auxiliary electrode directly covers only a peripheral portion of the second electrode so as to partially shield light emitted from the organic function layer, wherein the first electrode is partitioned on the substrate by a partition wall having an opening part on the first electrode, and wherein the partition wall includes a first partition wall and a second partition wall, and the first partition wall is formed to cover a portion of a top surface of the first electrode.

8. The organic EL device according to claim 7, wherein the auxiliary electrode includes an opening part, which has a shape similar to that of the second electrode, on the second electrode.

9. The organic EL device according to claim 8, wherein the auxiliary electrode includes an opening part, which has a shape similar to that of the opening part of the partition wall, on the second electrode.

10. The organic EL device according to claim 8, wherein the opening part of the auxiliary electrode is formed within a plane area of the first electrode.

11. The organic EL device according to claim 9, wherein the center of the opening part of the auxiliary electrode is disposed to coincide with the center of the second electrode or the center of the opening part of the partition wall.

12. The organic EL device according to claim 8, wherein the opening part of the auxiliary electrode has an approximately circular shape in a plan view.

13. The organic EL device according to claim 1, wherein the light shielding layer has a light reflecting property.

14. A line head comprising the organic EL device according to claim 1.

15. An electronic apparatus comprising the organic EL device according to claim 1.

16. The organic EL device according to claim 7, wherein the auxiliary electrode has a light reflecting property.

17. The organic EL device according to claim 1, further comprising:
    a second electrode contact wiring, formed outside of the first partition wall, for supplying a predetermined electric potential to the second electrode,
    wherein the light shielding layer is electrically contacted to the second electrode contact wiring.

18. The organic EL device according to claim 7, further comprising:
    a second electrode contact wiring, formed outside of the first partition wall, for supplying a predetermined electric potential to the second electrode,
    wherein the auxiliary electrode is electrically contacted to the second electrode contact wiring.

19. The top emission-type organic EL device according to claim 1, wherein the light shielding layer forms a single opening in a central region of a light emitting area.

20. The top emission-type organic EL device according to claim 7, wherein the auxiliary electrode forms a single opening in a central region of a light emitting area.

* * * * *